United States Patent
Miyamoto et al.

(10) Patent No.: US 9,235,047 B2
(45) Date of Patent: Jan. 12, 2016

(54) MEMS DISPLAY PIXEL CONTROL CIRCUITS AND METHODS

(75) Inventors: Mitsuhide Miyamoto, Kawasaki (JP); Katsumi Matsumoto, Mobara (JP); Takahide Kuranaga, Mobara (JP)

(73) Assignee: Pixtronix, Inc., San Diego, CA (US)

( * ) Notice: Subject to any disclaimer, the term of this patent is extended or adjusted under 35 U.S.C. 154(b) by 74 days.

(21) Appl. No.: 13/484,034

(22) Filed: May 30, 2012

(65) Prior Publication Data

US 2012/0306562 A1 Dec. 6, 2012

Related U.S. Application Data

(60) Provisional application No. 61/492,205, filed on Jun. 1, 2011.

(51) Int. Cl.
  G09G 3/34 (2006.01)
  G02B 26/08 (2006.01)
  H03K 3/037 (2006.01)
  G11C 23/00 (2006.01)

(52) U.S. Cl.
  CPC ............ G02B 26/0841 (2013.01); G09G 3/346 (2013.01); G11C 23/00 (2013.01); H03K 3/0375 (2013.01); *G09G 2300/0417* (2013.01); *G09G 2300/0857* (2013.01); *G09G 2310/0262* (2013.01)

(58) Field of Classification Search
  CPC ............... G09G 3/346; G09G 3/2022; G09G 2300/0417; G02B 26/0841; G11C 23/00
  USPC .......... 345/48, 83–84, 87–88, 90, 92, 95–96, 345/100, 108–109, 204, 214; 359/198, 214, 359/227, 290, 295, 298; 315/169.3

See application file for complete search history.

(56) References Cited

U.S. PATENT DOCUMENTS 7,196,837 B2 * 3/2007 Sampsell et al. .............. 359/290
7,248,090 B2    7/2007 Ramprasad
7,292,235 B2 * 11/2007 Nose ............................. 345/204

(Continued)

FOREIGN PATENT DOCUMENTS

CN  1540621 A  10/2004
EP  2037440 A2  3/2009

(Continued)

OTHER PUBLICATIONS

International Search Report and Written Opinion—PCT/US2012/040238—ISA/EPO—Dec. 13, 2012.
Taiwan Search Report—TW101119675—TIPO—May 13, 2014.

*Primary Examiner* — Kumar Patel
*Assistant Examiner* — Mansour M Said
(74) *Attorney, Agent, or Firm* — Edward A. Gordon; Foley & Lardner LLP

(57) ABSTRACT

This disclosure provides novel latching circuits, and pixel circuits and display devices that include such latching circuits. The latches herein include a switch positioned on an inverter coupling interconnect which couples two cross-coupled inverters of the latch. The switch is configured to control a passage of a current between the first and second inverters. By switching the switch OFF at a time a data voltage is transferred to the inverters, any leak current between the inverters can be interrupted. As a result, a malfunctioning of the data latch is prevented.

17 Claims, 16 Drawing Sheets

(56) References Cited

U.S. PATENT DOCUMENTS

| | | |
|---|---|---|
| 7,345,805 B2 | 3/2008 | Chui |
| 7,839,356 B2 | 11/2010 | Hagood et al. |
| 8,526,096 B2 | 9/2013 | Steyn et al. |
| 8,692,582 B1 | 4/2014 | Atesoglu et al. |
| 2002/0051096 A1 | 5/2002 | Yamazaki et al. |
| 2004/0119505 A1 | 6/2004 | Ryan |
| 2005/0219676 A1 | 10/2005 | Kimura et al. |
| 2006/0066598 A1* | 3/2006 | Floyd .............. 345/204 |
| 2007/0086078 A1 | 4/2007 | Hagood et al. |
| 2008/0174532 A1 | 7/2008 | Lewis |
| 2011/0164067 A1* | 7/2011 | Lewis et al. ........ 345/690 |
| 2014/0292738 A1 | 10/2014 | Yao |

FOREIGN PATENT DOCUMENTS

| | | |
|---|---|---|
| JP | S58133024 A | 8/1983 |
| JP | S6351716 A | 3/1988 |
| JP | 2001068558 A | 3/2001 |
| JP | 2002139683 A | 5/2002 |
| JP | 2005309416 A | 11/2005 |
| JP | 2008219491 A | 9/2008 |
| JP | 2010286849 A | 12/2010 |
| TW | 530175 B | 5/2003 |
| TW | 200901629 A | 1/2009 |
| WO | 2006076262 | 7/2006 |
| WO | 2006091738 A1 | 8/2006 |
| WO | 2009102471 A1 | 8/2009 |

* cited by examiner

MEMS DISPLAY PIXEL CONTROL CIRCUITS AND METHODS

CROSS-REFERENCE TO RELATED APPLICATIONS

This patent application claims priority to U.S. Provisional Patent Application No. 61/492,205, filed on Jun. 1, 2011, entitled "MEMS Display Pixel Control Circuits and Methods." The disclosure of the prior application is considered part of and is incorporated by reference in this patent application.

TECHNICAL FIELD

The disclosure relates to the field of latching circuits. In particular, this disclosure relates to pixel circuits and display devices that include the latching circuits.

DESCRIPTION OF THE RELATED TECHNOLOGY

Display devices use two-dimensional arrangements of light modulating elements to display images and video content. The display device can be used to display images by electrically controlling the position of a movable shutter. Selective modulation of light at each pixels of the two-dimensional array through actuation of the movable shutter (S) produces the images of each frame of the video content.

A display device that modulates the movable shutter by electrical means can facilitate faster shutter movement, and thus provide for faster pixel refresh rates during display.

Similar to a liquid crystal display panel, a pixel circuit can be arranged at each intersection of a scan line and a data line of the display, where each intersection corresponds to a pixel in the display. Each pixel circuit includes a latching circuit. The output voltages of the latching circuits are used to actuate a shutter associated with each pixel.

This disclosure provides novel latching circuits, and pixel circuits and display devices that include the latching circuits.

SUMMARY

The systems, methods and devices of the disclosure each have several innovative aspects, no single one of which is solely responsible for the desirable attributes disclosed herein.

One innovative aspect of the subject matter described in this disclosure can be implemented in an apparatus having a plurality of MEMS devices arranged in an array and a control circuit coupled to the plurality of MEMS devices to communicate data and drive voltages to the MEMS devices. For each MEMS device, the control circuit includes a latch configured to actuate a shutter of the MEMS device. The latch includes first and second cross-coupled inverters, each of which include at least two transistors. The latch also includes an inverter coupling interconnect that couples the gates of the at least two transistors of the first inverter to drains of the at least two transistors of the second inverter. The latch also includes a first switch positioned on the inverter coupling interconnect that is configured to control a passage of a voltage between the first and second inverters. In some implementations, the latch is coupled to a first actuator and a second actuator and is configured to maintain difference in voltages on the first and second actuators. In some such implementations, the first and second actuators actuate the shutter based on the difference in voltages.

In some implementations, the first switch includes an n-type transistor. In some implementations, the first switch includes a p-type transistor. In some implementations, the apparatus also includes a second switch that is coupled to the inverter coupling interconnect and to the gate of the at least two transistors of the first inverter and is configured to communicate the data to the gate of the at least two transistors of the first inverter. In some implementations, the first switch is switched to an OFF state at a time that the second switch communicates the data to the gate of the at least two transistors of the first inverter. In some implementations, the first switch is switched to an ON state after the time that the second switch communicates the data to the gate of the at least two transistors of the first inverter. In some implementations, the second switch includes a transistor and a drain of the second switch is coupled to the inverter coupling interconnect and to the gate of the at least two transistors of the first inverter. In some implementations, the first switch and the second switch each include a transistor and the apparatus further includes a latching control line, and the latching control line is coupled to a respective gate of the first switch and of the second switch. In some implementations, the transistor of the first switch is of a different conductivity type from the transistor of the second switch. In some implementations, the first switch and the second switch each include a transistor and the apparatus further includes a latching control line coupled to the first switch and a data transfer control line coupled to the second switch. In some such implementations, a latch control signal from the latching control line causes the first switch to switch to an OFF state at a time that the second switch communicates the data to the gate of the at least two transistors of the first inverter based on a data transfer control signal from the data transfer control line. In some implementations, a gate of the first switch is coupled to the latching control line. In some implementations, a gate of the second switch is coupled to the data transfer control line. In some implementations, the apparatus is a display apparatus and the MEMS device comprises a shutter. In some such implementations, the latch is coupled to a first actuator and a second actuator and is configured to maintain difference in voltages on the first and second actuator and the first and second actuators actuate the shutter based on the difference in voltages.

Another innovative aspect of the subject matter described in this disclosure can be implemented in an apparatus that includes a plurality of MEMS devices arranged in an array and a control circuit coupled to the plurality of MEMS devices to communicate data and drive voltages to the MEMS devices. For each MEMS device, the control circuit includes a latch configured to actuate a shutter of the MEMS device. The latch includes two cross-coupled inverters, each of which includes at least two transistors. The latch also includes a first switch positioned on an inverter coupling interconnect that couples a common gate of the at least two transistors of the first inverter to a common drain of the at least two transistors of the second inverter. The latch also includes second switch that is coupled to the inverter coupling interconnect and to the gate of the at least two transistors of the first inverter and a third switch that is coupled to a power supply line, to the second switch and to the gate of the at least two transistors of the first inverter.

In some implementations, the second switch is configured to communicate the data to the gate of the at least two transistors of the first inverter. In some implementations, the second switch includes a transistor and the third switch is coupled to a drain of the second switch. In some implementations, the latch further includes a fourth switch that is connected between the common gate of the at least two transistors of the first inverter to a common drain of the at least two transistors of the second inverter. In some implementations, the latch further includes a capacitor that couples the third switch to the gate of the at least two transistors of the first inverter and the latch is configured such that the first switch is in an OFF state at a time that (i) the third switch and the fourth switch are switched to an OFF state and subsequently switched to an ON state, and (ii) at a subsequent time that the second switch communicates the data to the gate of the at least two transistors of the first inverter through the capacitor. In some implementations, the latch is coupled to a first actuator and a second actuator and configured to maintain difference in voltages on the first and second actuators, and the first and second actuators actuate the shutter based on the difference in voltages.

Details of one or more implementations of the subject matter described in this specification are set forth in the accompanying drawings and the description below. Although the examples provided in this summary are primarily described in terms of MEMS-based displays, the concepts provided herein may apply to other types of displays, such as LCD, OLED, electrophoretic, and field emission displays, as well as to other non-display MEMS devices, such as MEMS microphones, sensors, and optical switches. Other features, aspects, and advantages will become apparent from the description, the drawings, and the claims. Note that the relative dimensions of the following figures may not be drawn to scale.

DETAILED DESCRIPTION

Figure 1:
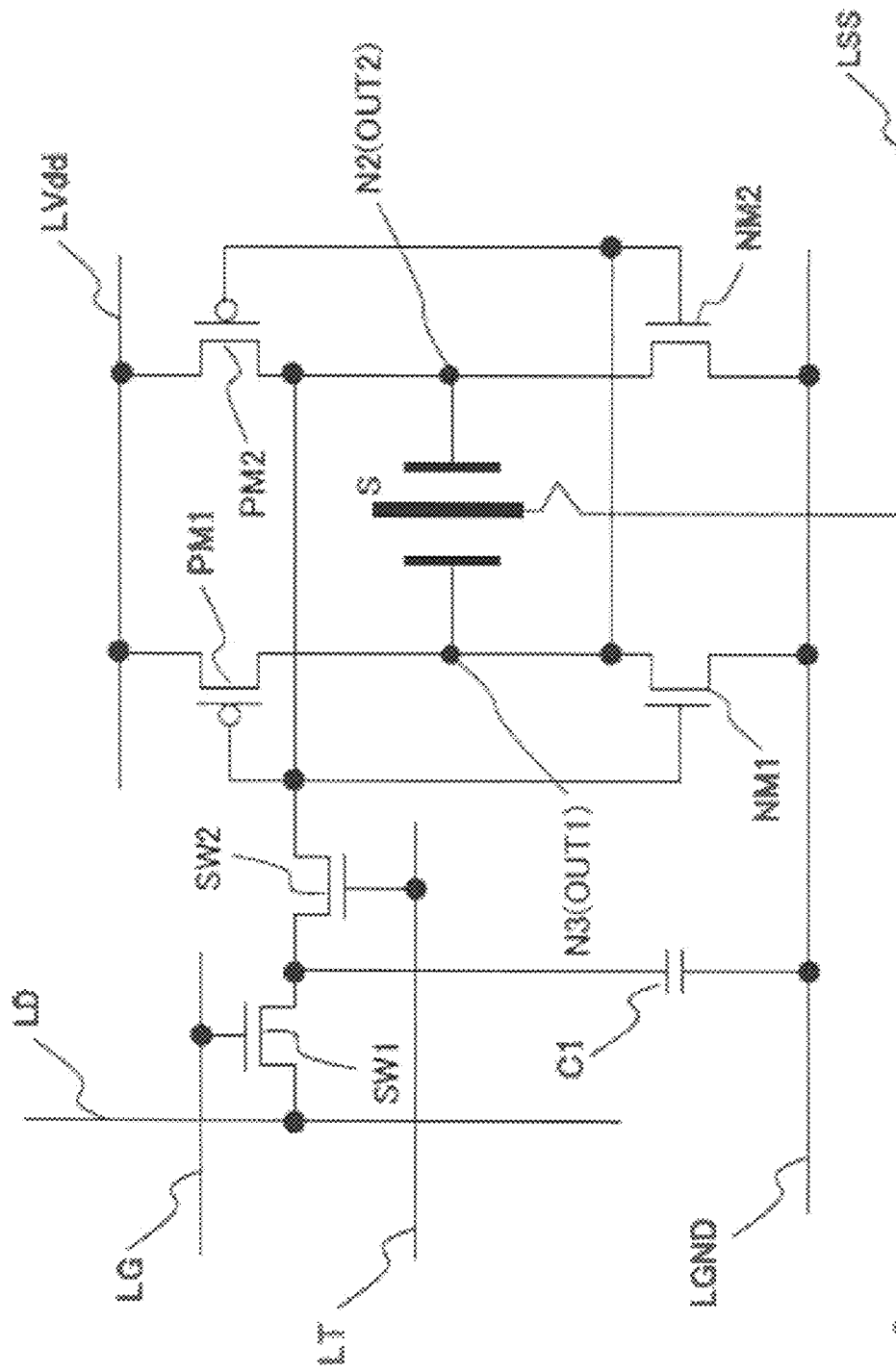
FIG. 1 shows an example latching circuit.

A latching circuit can be formed from two cross-coupled inverters, each of which includes two transistors: a p-type metal-oxide-semiconductor (p-MOS) transistor and an n-type MOS transistor (n-MOS). In some implementations, the p-MOS transistor governs the charging of a light modulator actuator, and thus is referred to as a charge transistor. The n-MOS transistor governs the discharge of the actuator, and thus is referred to as a discharge transistor.

The two inverters are coupled by two inverter coupling interconnects. An inverter coupling interconnect couples the gates of the two transistors of one of the inverters to the drains of the two transistors of the other inverter. The flow of current through at least one of the inverter coupling interconnects is governed by a switch.

The latching circuit also includes a retention capacitor used to store a data voltage and a switch that couples the retention capacitor to the two cross-coupled inverters.

Similar latching circuits that lack a switch that governs the flow of current through at least one of their inverter coupling interconnects may potentially latch into an incorrect state if a discharge transistor has too great a leakage current or if a discharge transistor does not turn OFF quickly enough. For example, in some implementations, the retention capacitor may be coupled to the gates of the transistors of a first inverter and, through the inverter coupling interconnect, to the drain of the discharge transistor of the second inverter. If that discharge transistor has too high a threshold voltage or remains open too long, resulting in current leakage, charge stored on the retention capacitor may be drained through the discharge transistor of the second inverter before it has had the opportunity to appropriately affect the state of the first inverter. Introducing a switch on the inverter coupling interconnect effectively isolates the retention capacitor, and thus the data voltage stored thereon, from potential discharge until the state of the first inverter is set.

This disclosure provides latching circuits with at least one switched inverter coupling interconnect, as well as pixel circuits and display devices that include such latching circuits. The switch on the inverter coupling interconnect is configured to control a passage of a current between the first and second inverters. By switching the switch OFF at the time of initial data voltage transfer from the retention capacitor to the inverters, leak currents between the inverters can be interrupted. As a result, the malfunctioning of the latch can be prevented and reliability is improved.

Particular implementations of the subject matter described in this disclosure can be implemented to realize one or more of the following potential advantages. The latching circuits provide for fast, reliable latching of data into pixel circuits. More particularly, providing a switch on an inverter coupling interconnect effectively isolates a data voltage stored on a retention capacitor until it has appropriately set the state of a first inverter and prevents malfunctions resulting from discharge transistors with unacceptable levels of current leakage.

FIG. 1 shows an example latching circuit. More particularly, FIG. 1 shows a circuit diagram of a pixel circuit that can be used to actuate a movable shutter (S) of a display. In operation, an image is displayed using the pixel circuit, by controlling the outputs (OUT1 and OUT2) of the circuit. The outputs (OUT1 and OUT2) of the pixel circuit are used to control the position of the movable shutter (S) electrically.

The movable shutter (S) is moved with high speed along direction of the electrical field between the outputs (OUT1 and OUT2) of the pixel circuit of FIG. 1. Hence, when a movable shutter (S) is at a ground voltage (GND), e.g., when Node (N2) has a voltage GND, and Node (N3) has a voltage Vdd, the movable shutter (S) moves towards Node (N3). When Node (N2) has a voltage Vdd and Node (N3) has a Voltage GND, the movable shutter (S) moves with high speed towards Node (N2).

Movement of the movable shutter changes the luminescent state of a pixel of the display. For example, when the movable shutter (S) is moved towards Node (N2), light emitted by the backlight of the display is transmitted by the pixel, and the pixel is in a luminescent state. When the movable shutter (S) moves towards Node (N3), the light emitted by the backlight is not transmitted by the pixel, and the pixel is in a non-luminescent state.

Figure 2:
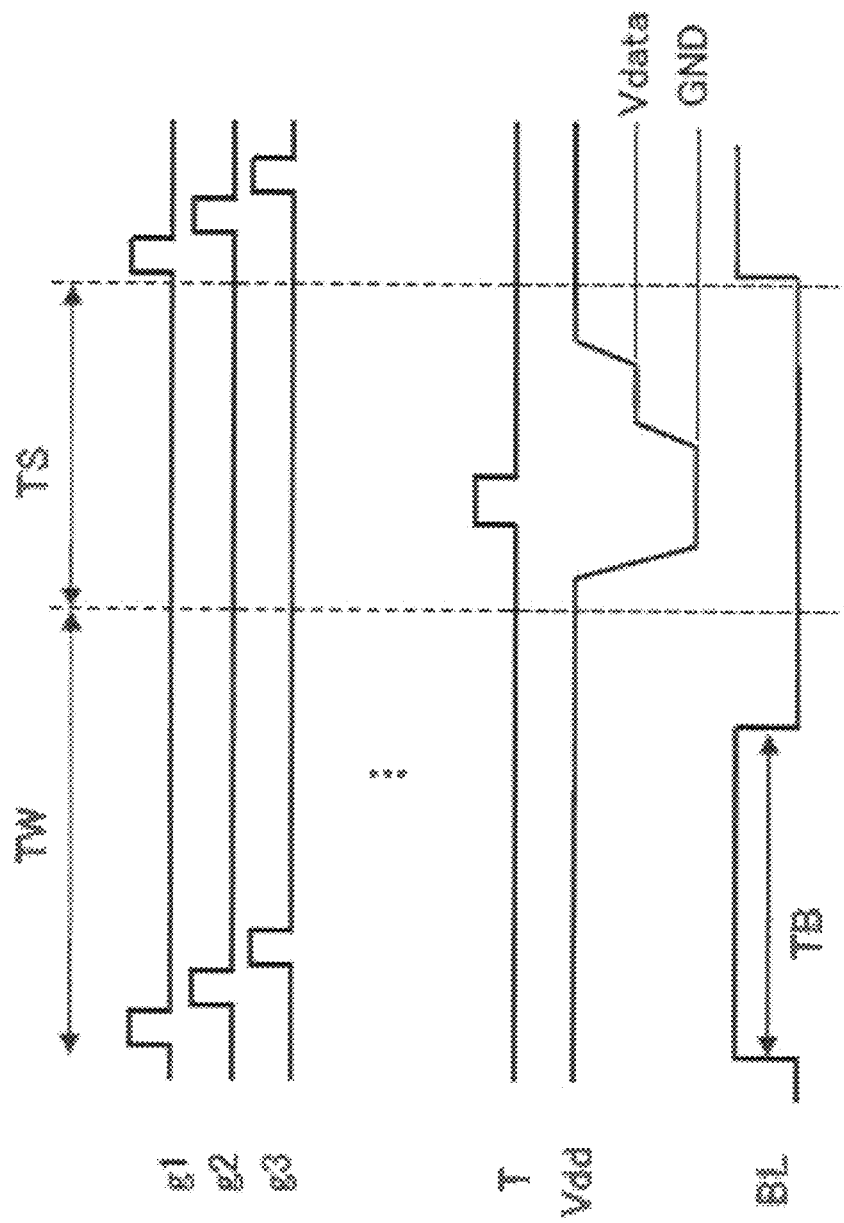
FIG. 2 shows an example timing diagram for operation of the latching circuit of FIG. 1.

FIG. 2 shows an example timing diagram for operation of the latching circuit of FIG. 1. The operation of the pixel circuit of FIG. 1 is described below relative to FIG. 2.

As shown in FIG. 2, in a display, a frame period can be separated into a writing/illumination period (TW) and a shutter movement period (TS). In FIG. 2, BL indicates the backlight output and TB indicates the backlight illumination period.

In the writing/illumination period (TW), scan voltages (gn, where n=1, 2, 3) are applied sequentially on the scan line (LG). If the scan voltage on a scan line (LG) is changed from a low level (hereafter, an L level) voltage to a high level (hereafter, an H level) voltage, an input transistor (SW1) is switched ON. The input transistor is an n-MOS transistor. The voltage on data line (LD) is stored on the retention capacitor (C1).

The backlight (BL) is switched OFF in the period of shutter movement (TS), and the voltage on the power-supply line (LVdd) becomes voltage GND. In this state, since the data transfer control signal (T) of the data transfer control line (LT) is of an H level voltage, a switching transistor (n-MOS transistor; SW2) is switched ON and the voltage on the retention capacitor (C1) is input in the gate of the p-MOS charge transistor (PM1) and n-MOS discharge transistor (NM1).

Subsequently, after the data transfer control signal (T) on the data transfer control line (LT) is changed to an L level voltage, the voltage on the power-supply line (LVdd) is changed from a voltage GND to a voltage Vdata. In this state, the voltage of Node (N2) and Node (N3) is determined.

At this time, the voltage on the power-supply line (LVdd) becomes the voltage Vdd and voltage of Node (N2) and Node (N3) is increased.

When the voltage on retention capacitor (C1) is an L level voltage, p-MOS charge transistor (PM1) and n-MOS discharge transistor (NM2) are switched ON. The p-MOS charge transistor (PM2) and n-MOS discharge transistor (NM1) are switched OFF. Node (N2) (output terminal (OUT2)) is at an L level voltage GND and Node (N3) (output terminal (OUT1)) is at an H level voltage Vdd.

When the voltage on retention capacitor (C1) is an H level voltage, the p-MOS charge transistor (PM2) and n-MOS discharge transistor (NM1) are switched ON and p-MOS charge transistor (PM1) and n-MOS discharge transistor (NM2) are switched OFF. As a result, Node (N2) (output terminal (OUT2)) acquires the H level voltage Vdd, and Node (N3) (output terminal (OUT1)) acquires the L level voltage GND. In an example, the H level voltage Vdd can be 25V and the voltage Vdata can be 5V. In FIG. 1, LGND is the power-supply line and provides ground voltage (GND) and LSS is the movable shutter control line.

Figure 3:
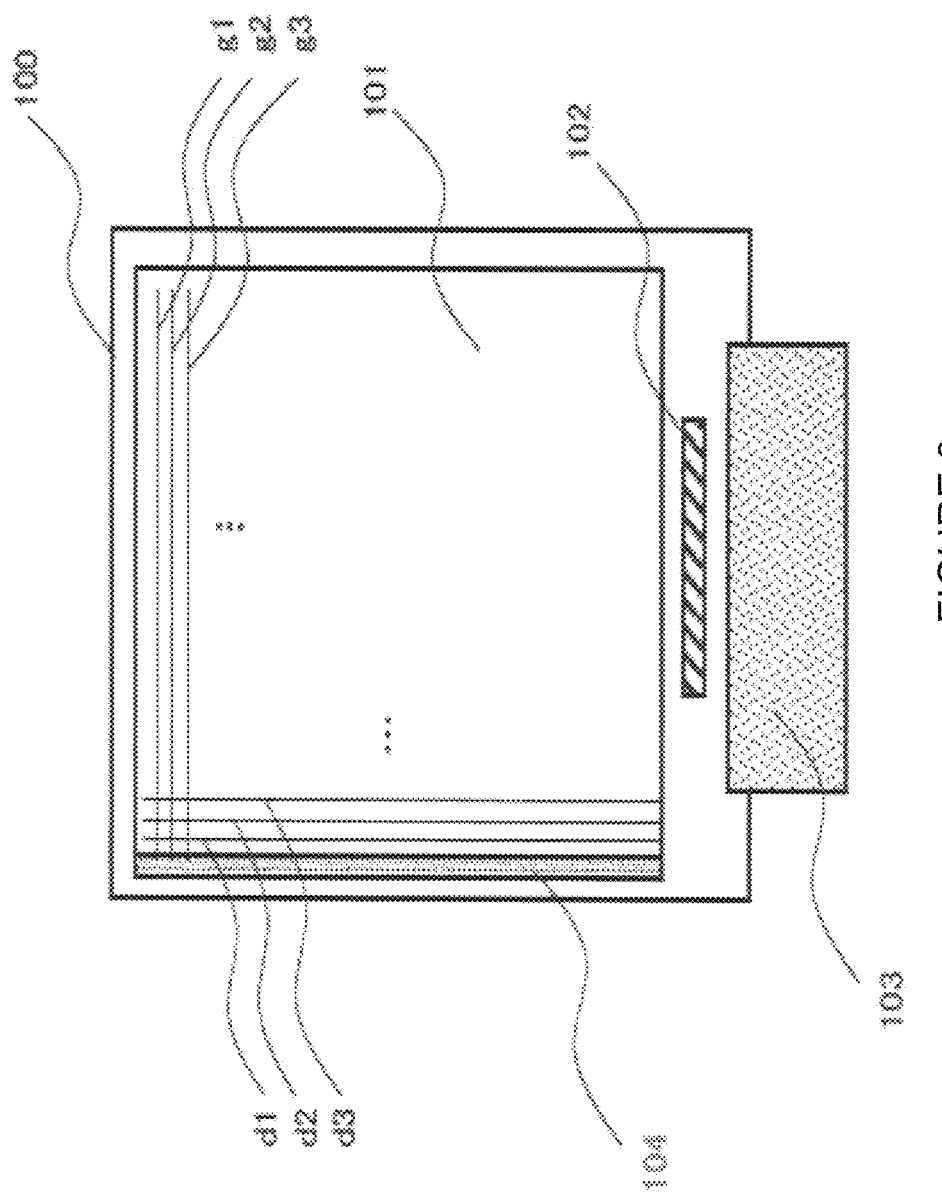
FIG. 3 shows an example block diagram of a display panel.

FIG. 3 shows an example block diagram of a display panel 100. The display area 100 has a display area 101. FIG. 3 shows the display panel 100, a scan line driving circuit 104, and a data line driving circuit 102. The display data and display control signals are transmitted to the display panel 100 from an external source through a flexible printed circuit 103.

Multiple scan lines (g1, g2, g3, . . . ) provide selected scan signals from the scan line driving circuit 104. Multiple data lines (d1, d2, d3, . . . ) arranged in the display area 101 supply data voltages from a data line driving circuit.

Similar to a liquid crystal display panel, a pixel circuit is arranged at positions at which there is an intersection of scan lines (g1, g2, g3, . . . ) and data lines (d1, d2, d3, . . . ).

In an example, the scan line driving circuit 104 and the data line driving circuit 102 can be configured in a circuit that is fabricated on a semiconductor chip mounted on a substrate. In another example, the scan line driving circuit 104 and data line driving circuit 102 can be configured in a circuit having n-MOS transistors and p-MOS transistors in which a semiconductor layer is formed on a poly-crystalline substrate.

Figure 4:
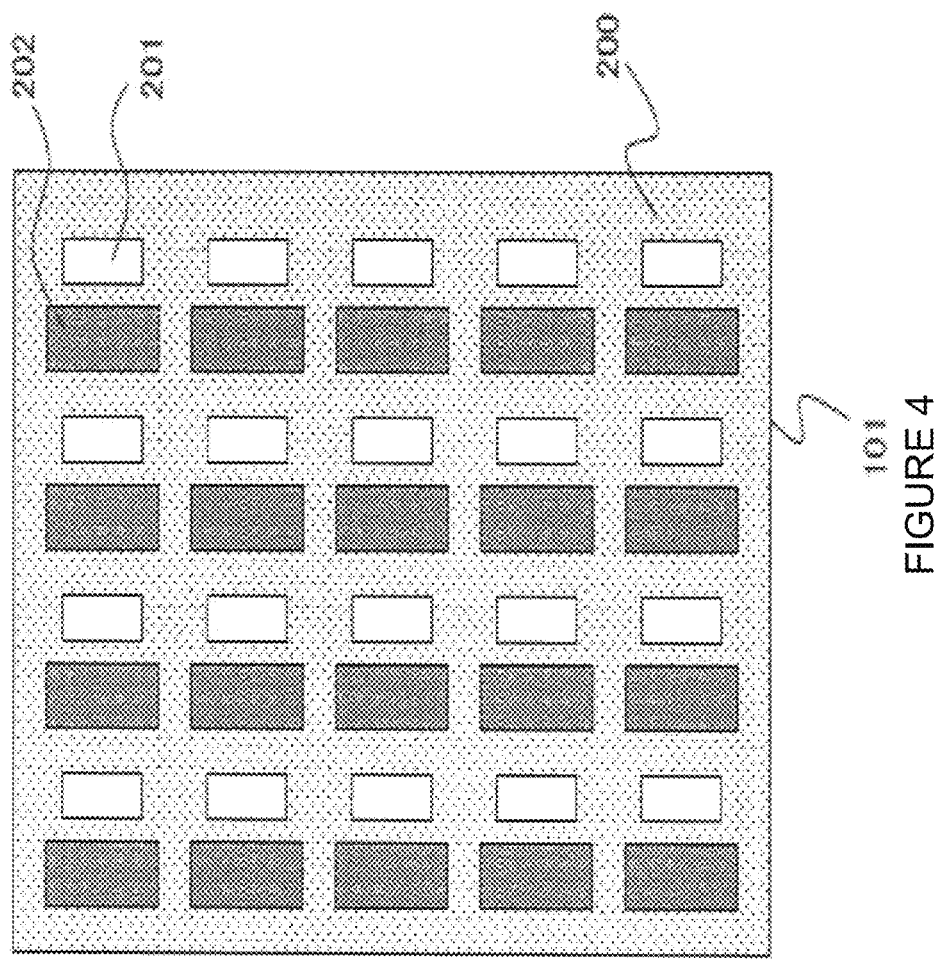
FIG. 4 shows an example display device.

FIG. 4 shows an example display device. As shown in FIG. 4, multiple openings 201 are formed in the display area 101 of a first substrate 200. The opening and closing of each opening is controlled by a movable shutter 202.

In the example of FIG. 4, a pixel is considered to be in a closed state if the movable shutter 202 covers the opening 201. When the opening 201 corresponding to the movable shutter 202 is open, light from the backlight is transmitted and the corresponding pixel is in a luminescent state. If the opening 201 corresponding to the movable shutter 202 is covered, light from the backlight is not transmitted and the corresponding pixel is in a non-luminescent state. The display generates an image by cycling a pixel between the luminescent and non-luminescent states.

Figure 5:
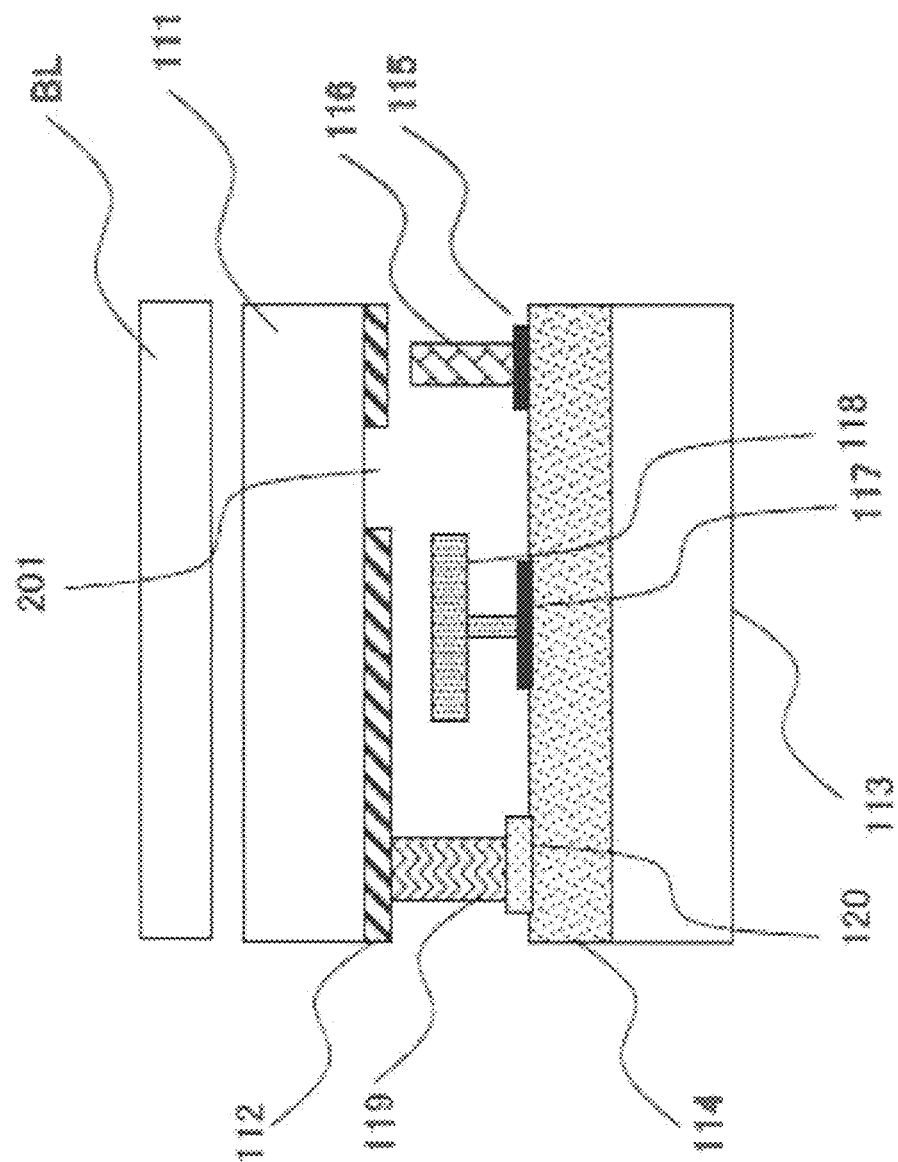
FIG. 5 shows an example cross-sectional view of a display device.
Figure 6:
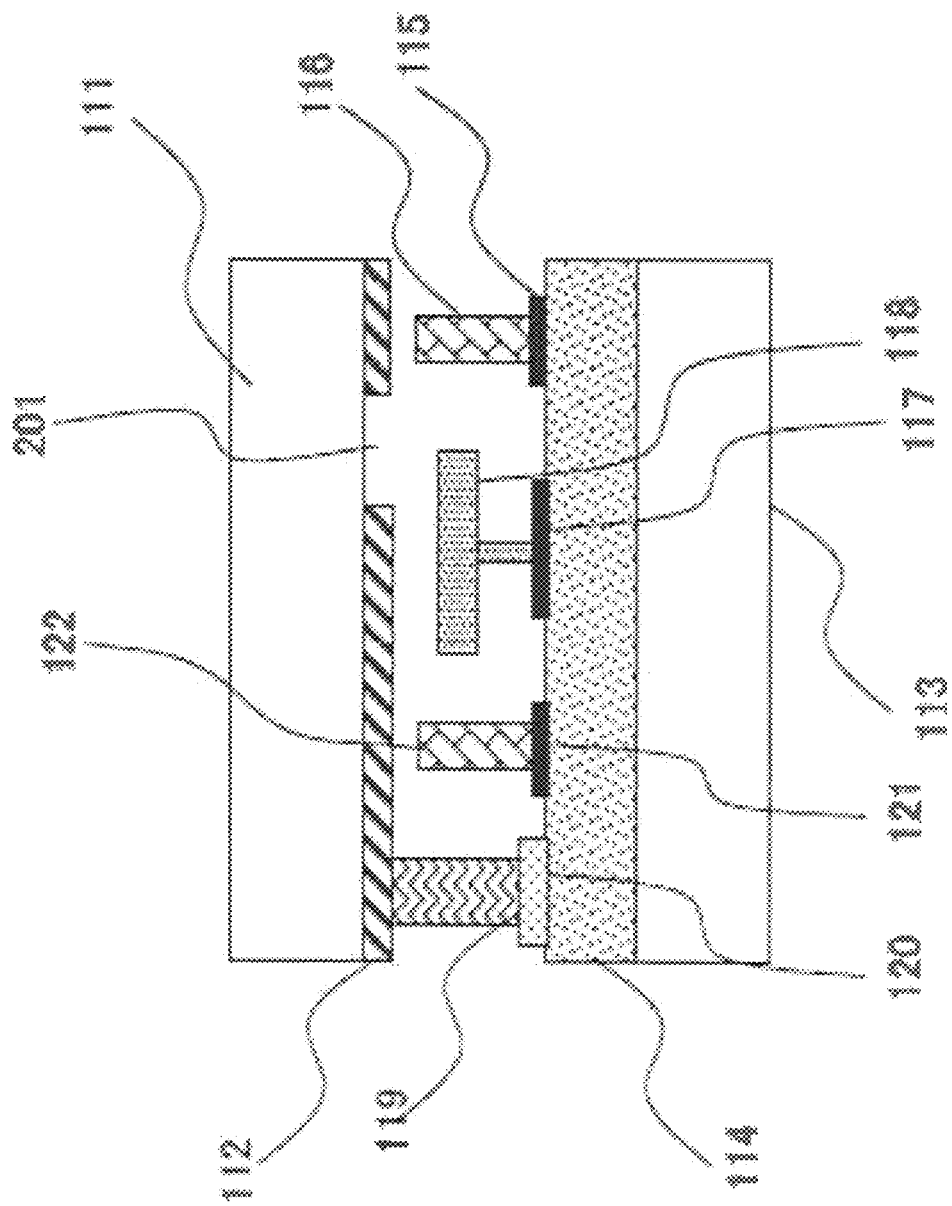
FIG. 6 shows another example cross-sectional view of a display device.

FIG. 5 shows an example cross-sectional view of a display device. FIG. 6 shows another example cross-sectional view of a display device.

In FIG. 5 and FIG. 6, the displays include a first substrate 111 and a second substrate 113. A light interception film 112 is formed on the first substrate 111, except for an area corresponding to the opening 201. As shown in FIG. 5, a backlight (BL) is positioned on one side of the first substrate 111. Thin-film transistor (TFT) circuitry 114 is positioned on the second substrate 113. In an example, the pixel circuits described herein can be formed as TFT circuitry 114.

A movable shutter 118 is disposed above the TFT circuitry 114. One or more of the voltages described herein can be applied through the contact part 117 of the movable shutter 118.

In FIG. 5, first electrode 116 is set on the TFT circuitry 114. An output voltage from the pixel circuit (described in greater detail below) is applied through the contact part 115 of the first electrode 116.

In FIG. 5, movable shutter 118 is moved towards a first electrode 116 by applying an electric field between the movable shutter 118 and the first electrode 116.

In the example of FIG. 6, the first electrode 116 and a second electrode 122 are set on the TFT circuitry 114. An output voltage from one of the two output terminals of the pixel circuit is provided through the contact part 115 of the first electrode 116. The other output voltage from the other output terminal of the pixel circuit is provided through the contact part 121 of the second electrode 122. In FIG. 6, the movable shutter 118 is moved towards the first electrode 116 when an electric field is applied between the movable shutter 118 and the first electrode 116. Similarly, the movable shutter 118 is moved towards the second electrode 122 by applying an electric field between movable shutter 118 and the second electrode 122.

In FIG. 5 and FIG. 6, a spacer 119 maintains the distance between the first substrate 111 and the second substrate 113, and a contact part 120 is arranged between the spacer 119 and TFT circuitry 114. In FIG. 5 and FIG. 6, only a single pixel is shown. However, it is understood that the displays herein include an array of multiple pixels.

Figure 7:
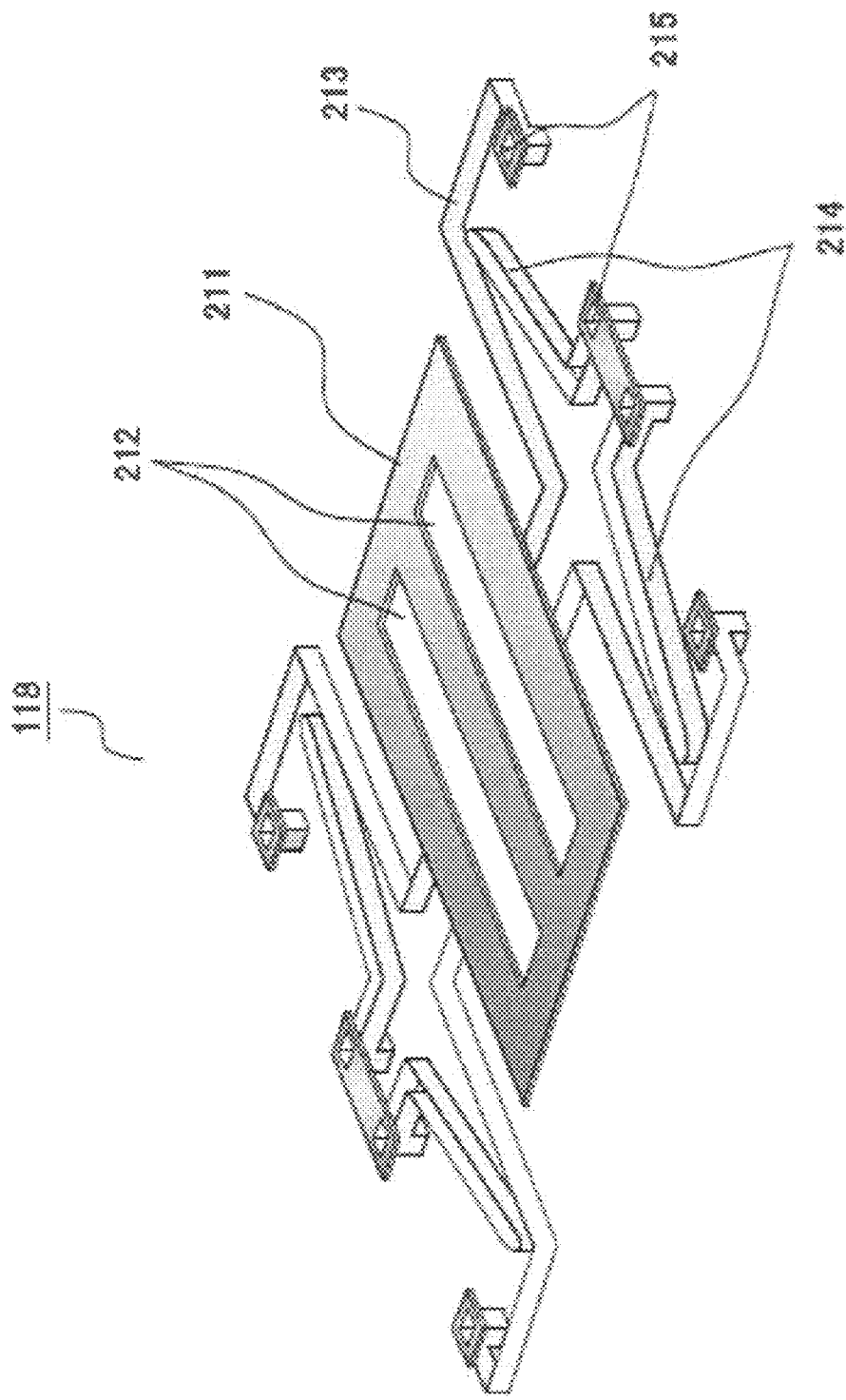
FIG. 7 shows a view of an example movable shutter.
Figure 8:
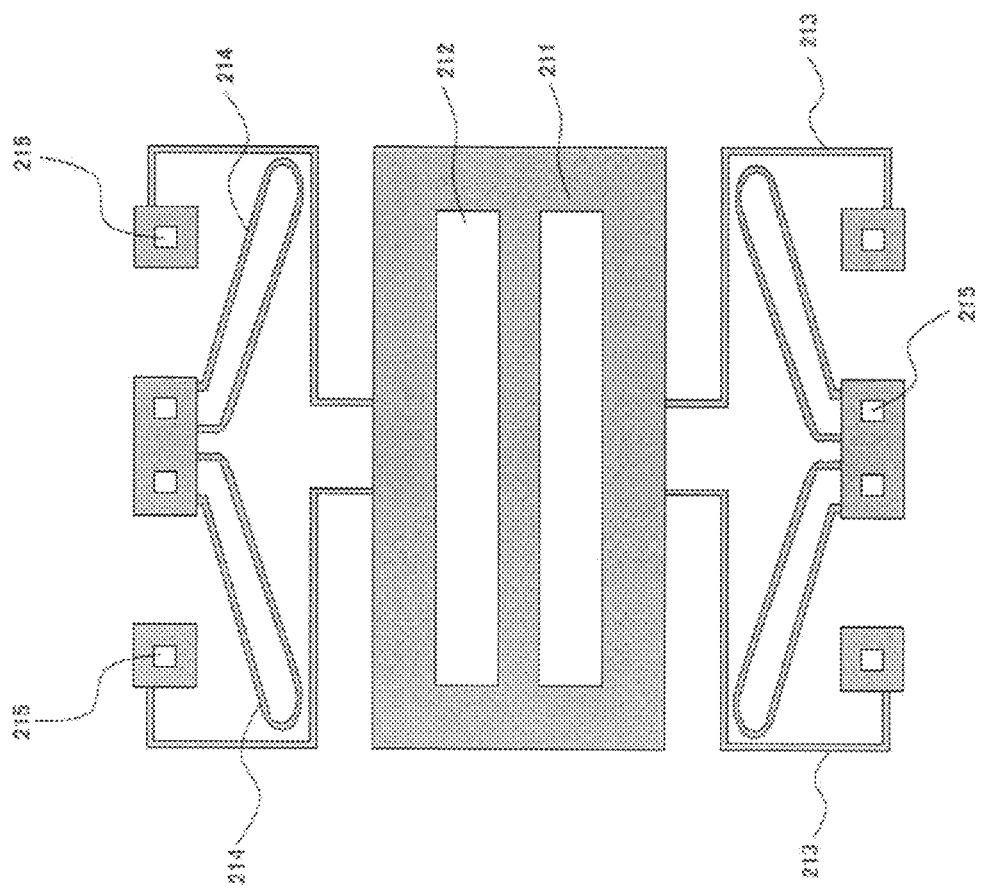
FIG. 8 shows an example plan view of the movable shutter shown in FIG. 7.

FIG. 7 shows an example of a movable shutter 118. The movable shutter 118 can be actuated as described in connection with FIG. 6. FIG. 8 shows an example plan view of the movable shutter shown in FIG. 7.

FIG. 7 and FIG. 8 show a light shielding part 211, an opening part 212, a first spring 213, a second spring 214, and an anchor part 215 of the movable shutter.

In an example, the anchor part 215 can be used for a dual purpose: as a means for attaching the movable shutter 118 to second substrate 113, and as a power feeding point from the TFT circuitry 114.

The light shielding part 211 and the opening part 212 of the movable shutter are disposed above the first spring 213 in such a way that they are raised above the substrate.

The light shielding part 211 and the opening part 212 of the movable shutter are actuated by moving the first spring 213 against the second spring 214 by applying an electric field between the first spring 213 and the second spring 214.

In the movable shutter shown in FIG. 7 and FIG. 8, pixels are changed to a non-luminescent state by covering the opening 201 formed on the first substrate 111 in the light shielding part 211 of the movable shutter 118.

The example pixel circuit shown in FIG. 3 can be formed from n-MOS transistors and p-MOS transistors. In an example, the transistors are formed in a semiconductor layer formed from a poly-crystalline material (such as poly-crystalline silicon).

The threshold voltage ($V_{th}$) of n-MOS transistors and p-MOS transistors can fluctuate, e.g., if the semiconductor layer is formed from a poly-crystalline material. For example, the threshold voltage ($V_{th}$) of an n-MOS transistor or a p-MOS transistor that is fabricated using poly-crystalline material can fluctuate by about ±1V. As a result of this threshold voltage, the data latch may start malfunctioning. If the data latch malfunctions, the display may not display the image in the desired manner.

For example, when the threshold voltage ($V_{th}$) of the p-MOS charge transistor (PM2) is high, or when the threshold voltage ($V_{th}$) of the n-MOS discharge transistor (NM2) is low, a leak current of the p-MOS charge transistor (PM2) and the n-MOS discharge transistor (NM2) can be increased. The data voltage stored in retention capacitor (C1) may be lost through the p-MOS charge transistor (PM2) or the n-MOS discharge transistor (NM2) when switching transistor (n-MOS transistor; SW2) is switched ON. The result is a malfunctioning of the data latch.

Apparatus and methods described herein provide pixel circuits configured so that the potential malfunctioning of a data latch in a pixel circuit can be prevented.

Figure 9:
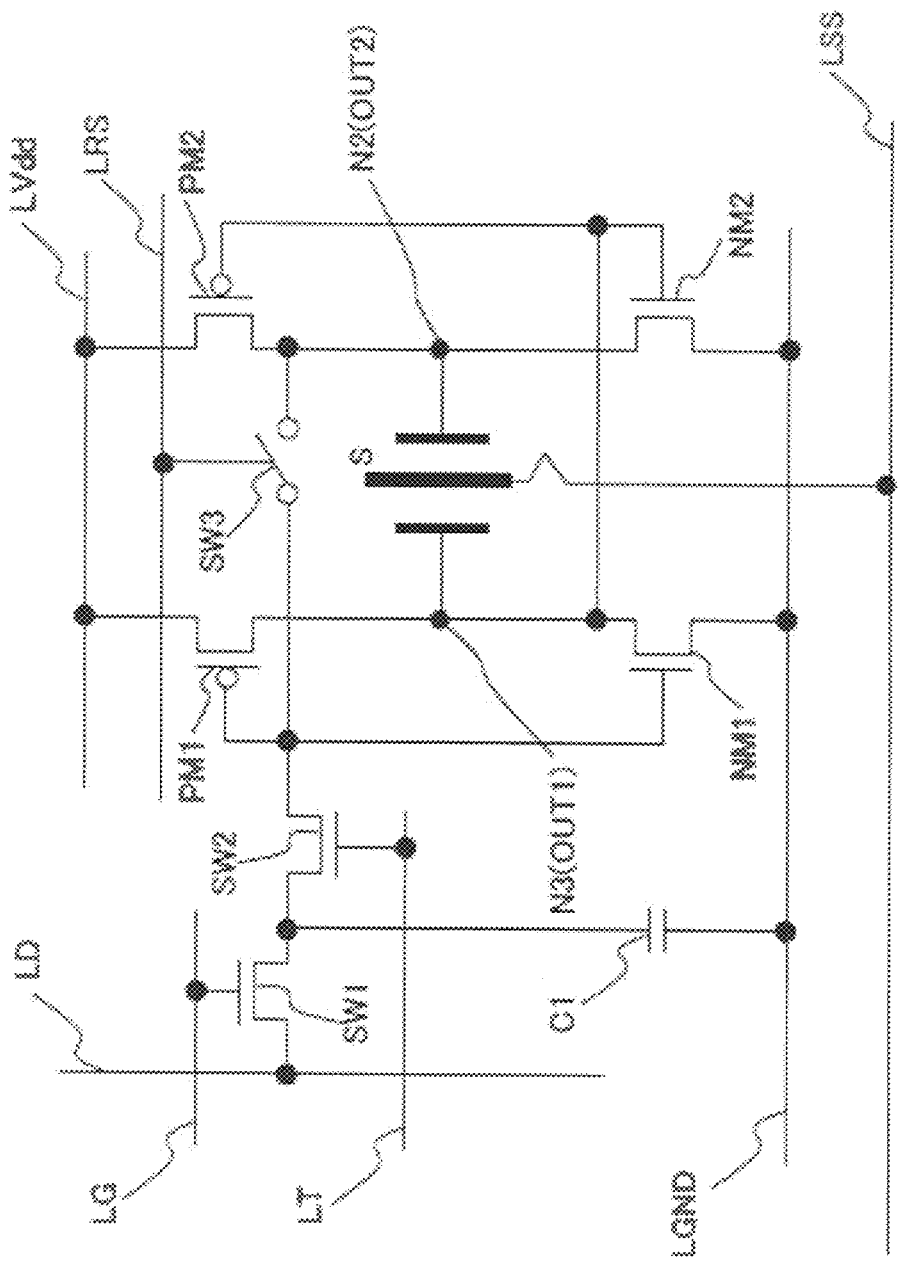
FIG. 9 shows an example pixel circuit that includes a movable shutter.

FIG. 9 shows an example pixel circuit that includes a movable shutter.

The example of FIG. 9 includes a latch that is configured to actuate a shutter of a display device. The display device may be a MEMS device.

The pixel circuit of FIG. 9 includes a latch. The latch includes two cross-coupled inverters, each of which includes two transistors. An inverter coupling interconnect couples the gates of the two transistors of one of the inverters to the drains of the two transistors of the other inverter. A switch is positioned on the inverter coupling interconnect. The switch is configured to control a passage of a current between the first and second inverters. Accordingly, a leak current can be prevented in the pixel circuit shown in FIG. 9.

Referring to FIG. 9, the first inverter is formed from a p-MOS charge transistor (PM1) and an n-MOS discharge transistor (NM1). The second inverter is formed from a p-MOS charge transistor (PM2) and an n-MOS discharge transistor (NM2). The pixel circuit includes a switch (SW3) located between the gate of the p-MOS charge transistor (PM1) and the n-MOS discharge transistor (NM1), i.e., the first inverter, and the drains of the p-MOS charge transistor (PM2) and n-MOS discharge transistor (NM2), i.e., the second inverter. The pixel circuit includes two inverter coupling interconnects that couple the gates of the two transistors of one of the inverters to the drains of the two transistors of the other inverter. The switch (SW3) is positioned on one of the inverter coupling interconnects.

In operation, by switching OFF the switch (SW3) using a latch control signal (RS) at the time of data voltage transfer, a leak current can be interrupted. That is, the latching circuit is configured to prevent a loss of the data voltage stored in the retention capacitor (C1) through the p-MOS charge transistor (PM2) and n-MOS discharge transistor (NM2) on the basis of the data transfer control signal (T) when switching transistor (n-MOS transistor; SW2) is switched ON. As a result, the malfunctioning of the data latch is prevented.

Figure 10:
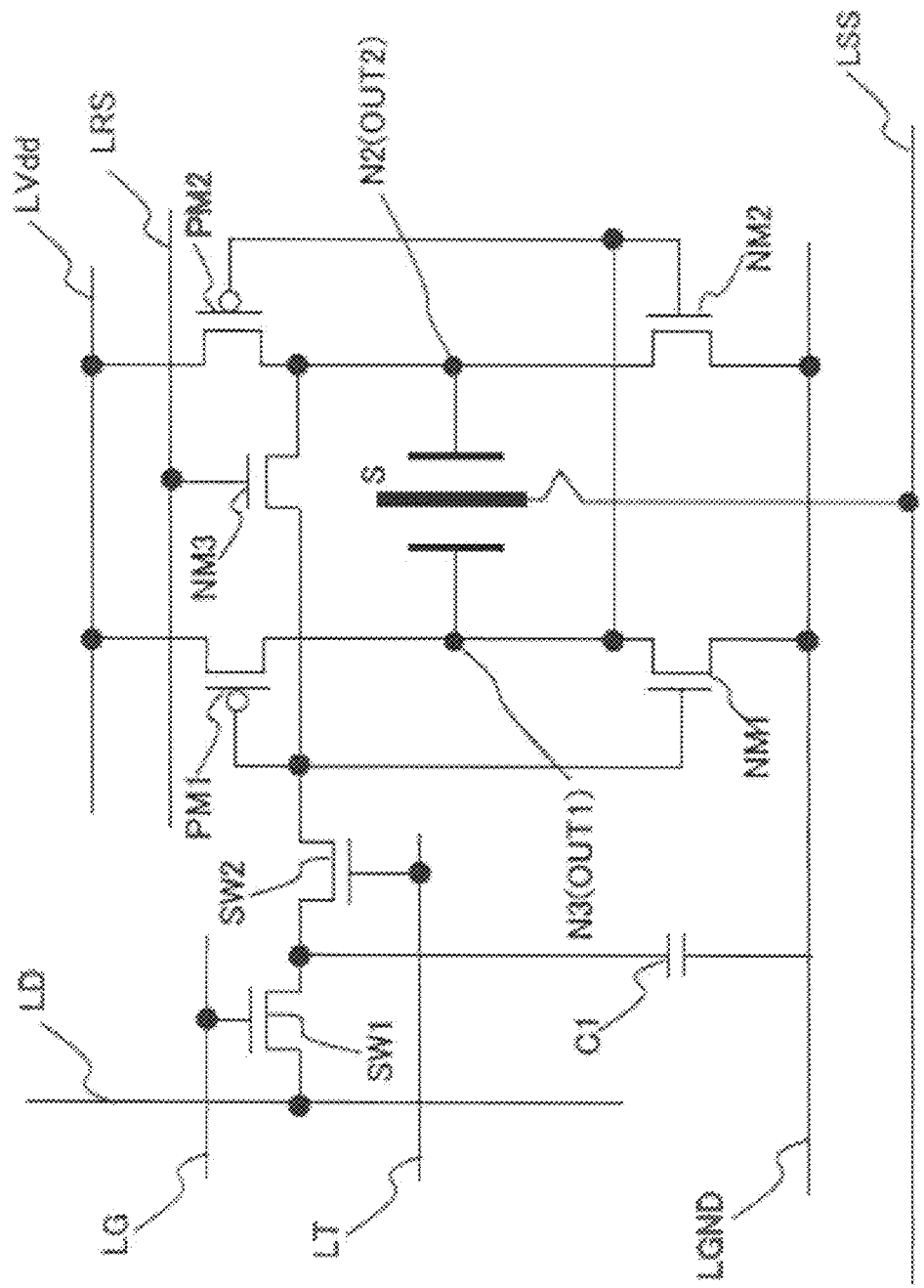
FIG. 10 shows another example pixel circuit that includes a movable shutter.
Figure 11:
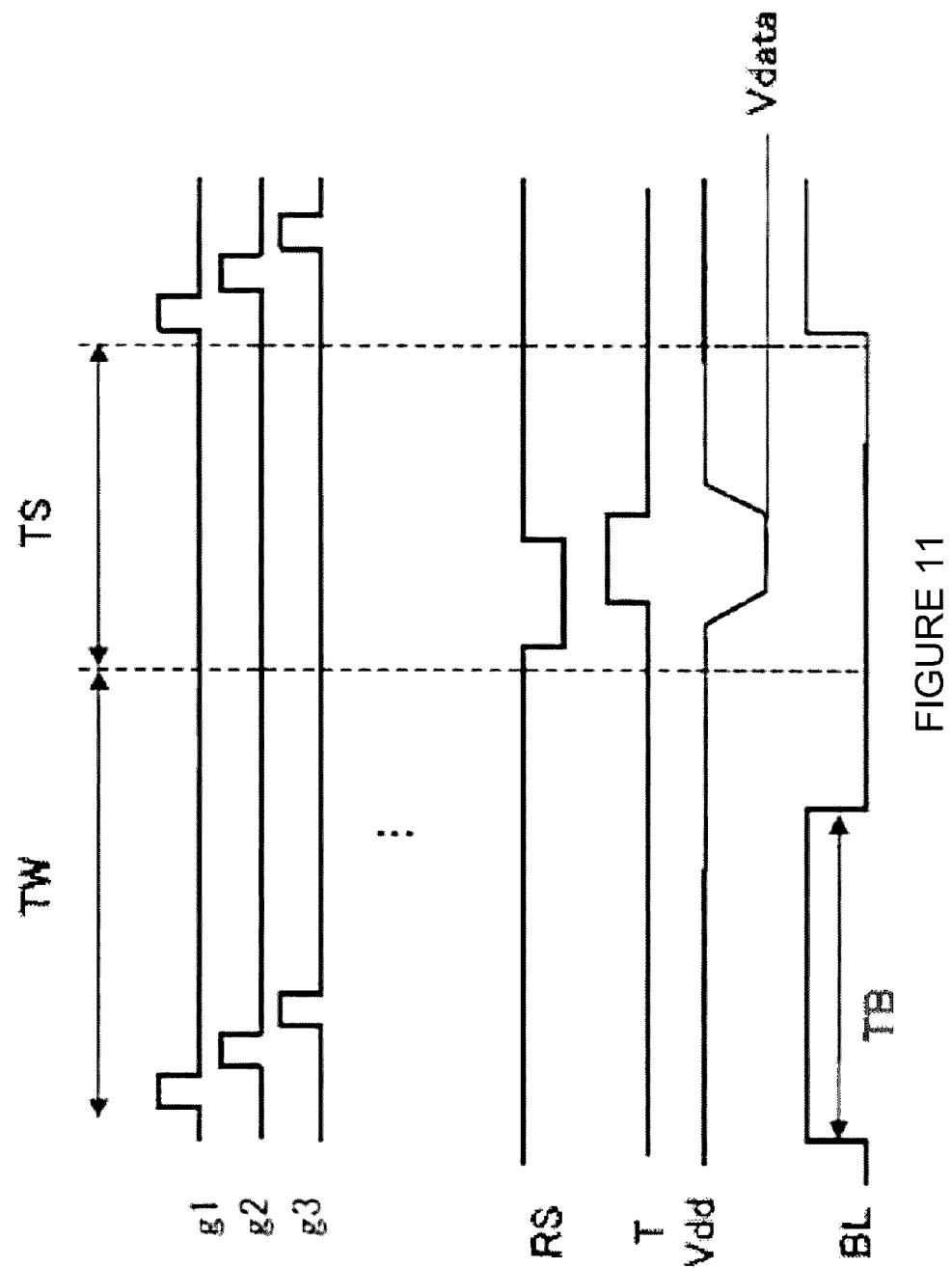
FIG. 11 shows an example timing diagram for operation of the pixel circuit of FIG. 9 or FIG. 10.

FIG. 10 shows another example pixel circuit that includes a movable shutter. In the pixel circuit of FIG. 10, the switch (SW3) shown in FIG. 9 is configured as an n-MOS transistor (NM3). FIG. 11 shows an example timing diagram for operation of the pixel circuits shown in FIGS. 9 and 10.

As shown in FIG. 11, a single frame period is separated into a writing/illumination period (TW) and a shutter movement period (TS). In FIG. 11, BL indicates the output of the backlight of a display and TB indicates the luminescent period of the backlight.

The operation of the pixel circuit of FIG. 10 during the writing/illumination period (TW) is similar to that of the pixel circuit shown in FIG. 1.

In the shutter movement period (TS), since the backlight (BL) is switched OFF and the latch control signal (RS) of the latch control line (LRS) is at an L level voltage, the n-MOS transistor (NM3) is switched OFF.

The voltage on power-supply line (LVdd) is the voltage Vdata. In this state, since the data transfer control signal (T) of the data transfer control line (LT) is at an H level voltage, the switch (n-MOS transistor; SW2) is switched ON and the voltage on retention capacitor (C1) is applied to the gate of p-MOS charge transistor (PM1) and n-MOS discharge transistor (NM1).

The latch control signal (RS) of the latch control line (LRS) is at an H level voltage and n-MOS transistor (NM3) is switched ON. The data transfer control signal (T) of data transfer control line (LT) acquires the L level voltage and the switch (n-MOS transistor; SW2) is switched OFF. In this state, the voltage of Node (N2) and Node (N3) is determined. The voltage Vdata is the H level voltage of the stored data voltage.

The voltage on power-supply line (LVdd) acquires the voltage Vdd and the voltage of Node (N2) and Node (N3) is increased.

As described above, the malfunctioning of the data latch can be prevented by switching the n-MOS transistor (NM3) OFF using the latch control signal (RS) at the time of data voltage transfer. In addition, fluctuation of the voltage of power-supply line (LVdd) can be reduced as compared to the pixel circuit of FIG. 1.

Figure 12:
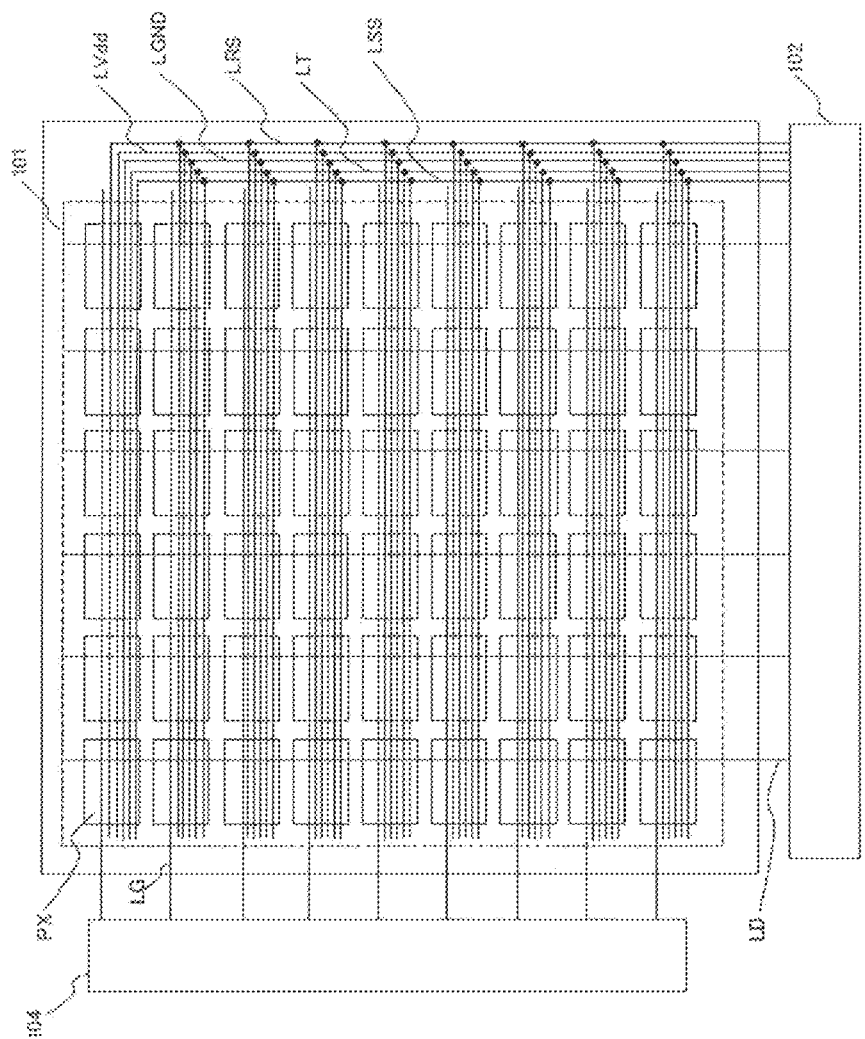
FIG. 12 shows an example display formed from an array of pixel circuits.

FIG. 12 shows an example display formed form an array of pixel circuits.

The display shown in FIG. 12 can be formed from a plurality of the pixel circuits shown in FIG. 8. The pixel circuits (indicated by PIX) are arranged in a two-dimensional array. Scan lines (LG) are coupled to every row and to a scan line driving circuit 104.

Data lines are coupled to every column and to a data line driving circuit 102. The power-supply lines (LVdd and LGND), the latch control line (LRS), the data transfer control line (LT) and the movable shutter control line (LSS) are coupled commonly to every pixel and connected to the data line driving circuit 102.

In the example of FIG. 2, data is written in every pixel (PIX) in every row unit during the writing/illumination period (TW), the movable shutter (S) is moved towards first electrode 116 or towards second electrode 122 in the period for shutter movement (TS), and an image is displayed during the writing/illumination period (TW).

Figure 13:
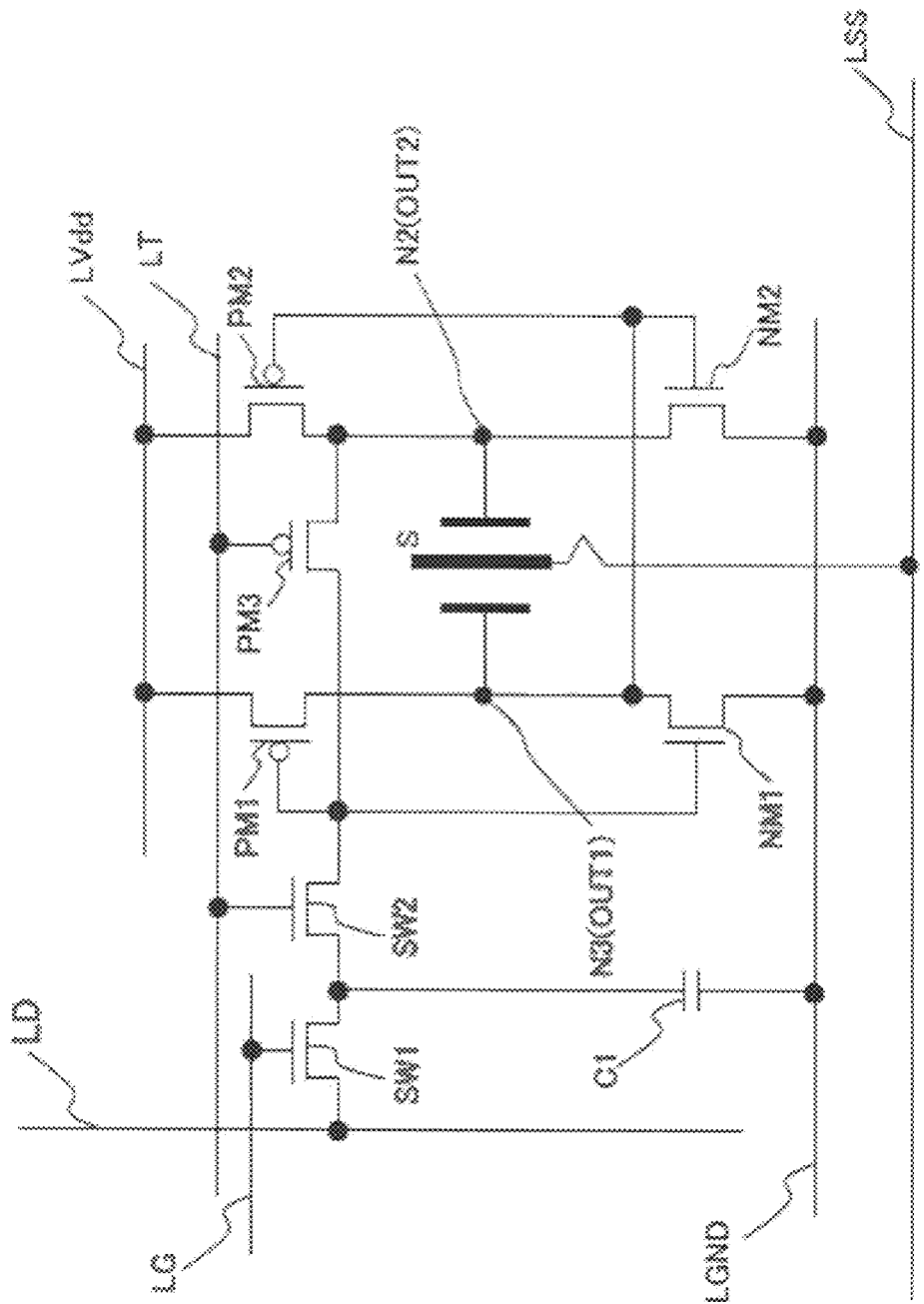
FIG. 13 shows an example circuit diagram of a pixel circuit.
Figure 14:
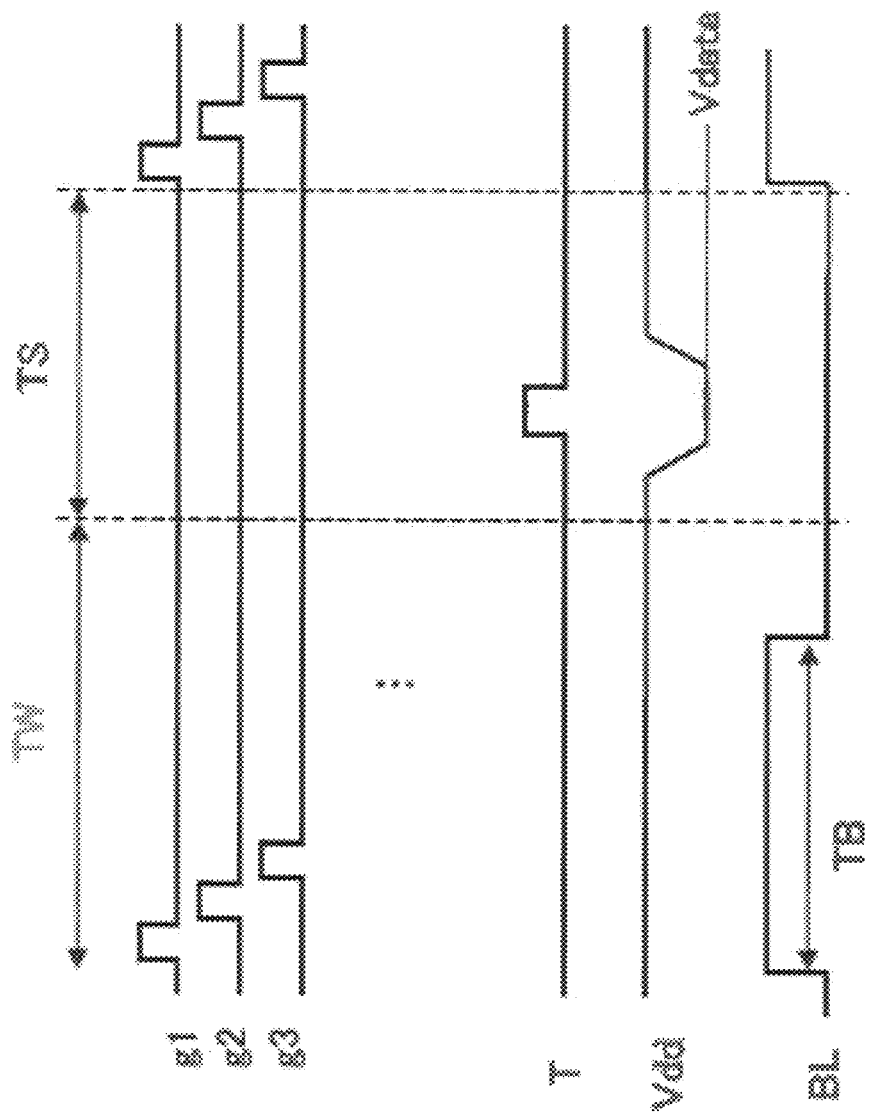
FIG. 14 shows an example timing diagram for use of the pixel circuit of FIG. 13.

FIG. 13 shows an example circuit diagram of a pixel circuit. In the pixel circuit of FIG. 13, the switch (SW3) shown in FIG. 9 is configured as a p-MOS transistor (PM3). FIG. 14 shows an example timing diagram for use of the pixel circuit shown in FIG. 13.

A description of the pixel circuit shown in FIG. 13 is given in conjunction with the description of FIG. 14. As shown in FIG. 14, a frame period is separated into a writing/illumination period (TW) and a shutter movement period (TS). The notation BL indicates the output of the backlight and TB is the illumination period of the backlight.

The operation of the pixel circuit of FIG. 13 during the writing/illumination period (TW) is the same as that of the pixel circuit shown in connection with FIG. 1.

The backlight (BL) is switched OFF during the shutter movement period (TS) and the voltage on the power-supply line (LVdd) is the voltage Vdata. The H level voltage Vdata is the voltage of the stored data voltage.

Since the data transfer control signal (T) of the data transfer control line (LT) is at an H level voltage, the p-MOS transistor (PM3) is switched OFF. The switch (n-MOS transistor; SW2) is switched ON. The voltage on the retention capacitor (C1) is applied to the gate of the p-MOS charge transistor (PM1) and the n-MOS discharge transistor (NM1). In this state, the voltage of Node (N2) and Node (N3) is determined.

The voltage on the power-supply line (LVdd) acquires the voltage Vdd, and the voltage of Node (N2) and Node (N3) is increased.

In this example, the malfunctioning of the data latch can be prevented by switching the p-MOS transistor (PM3) OFF using the data transfer control signal (T) at the time of data voltage transfer.

In the example of FIG. 13, the latch control line (LRS) can be omitted (as compared to the example of FIG. 10).

The example pixel circuit of FIG. 13 can be arranged in a two-dimensional array to provide a display. For example, in reference to FIG. 12, the pixel circuit of FIG. 13 can be used to form pixel (PIX). Scan lines (LG) are coupled to every row and to the scan line driving circuit 104.

Data lines (LD) are connected to every column and the data line driving circuit 102. The power-supply lines (LVdd, LGND), the data transfer control line (LT) and the movable shutter control line (LSS) are connected commonly to every pixel and to the data line driving circuit 102.

In an example display formed using an arrangement of the pixel circuits of FIG. 13, data is written to every pixel (PIX) in every row during the writing/illumination period (TW). A movable shutter (S) is moved towards a first electrode 116 or towards a second electrode 122 in the shutter movement period (TS), and an image corresponding to the stored data is displayed in the following writing/illumination period (TW).

Figure 15:
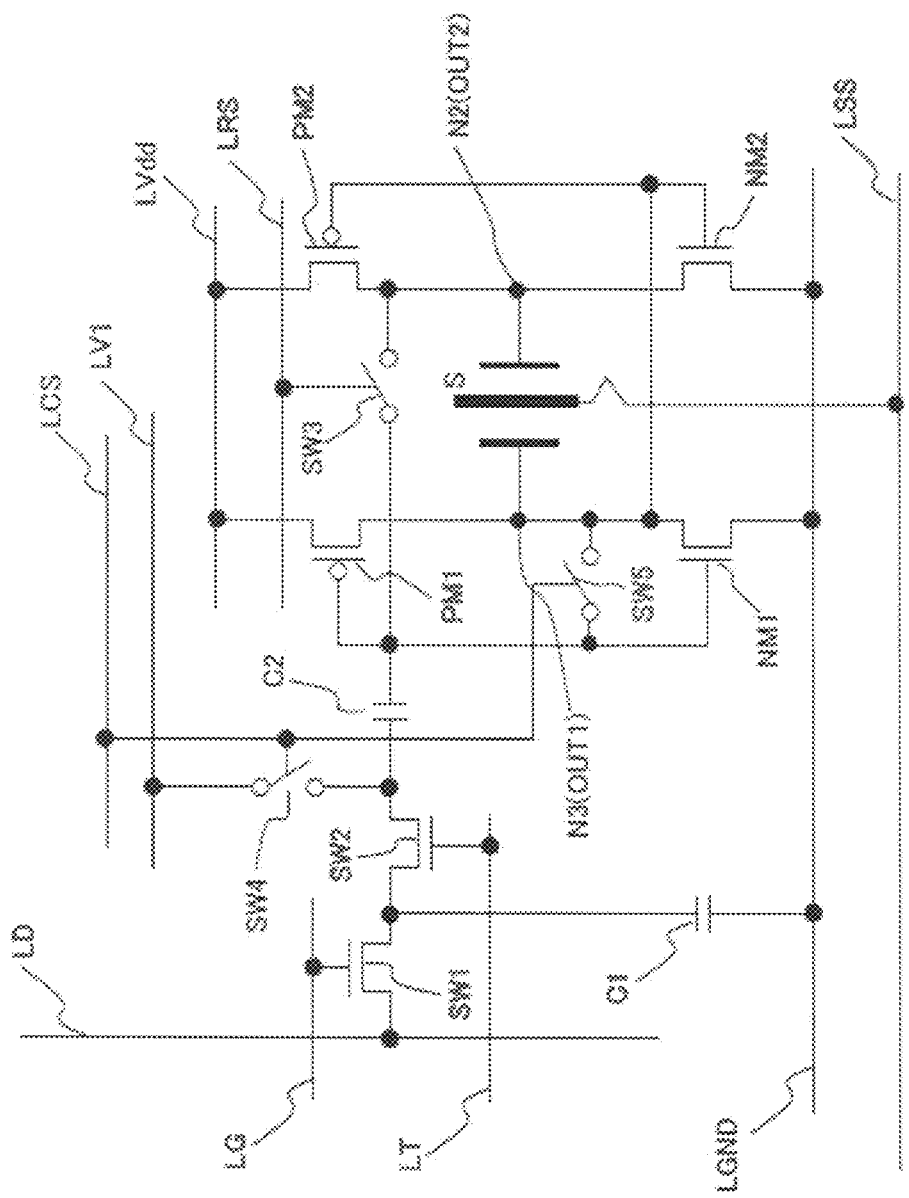
FIG. 15 shows yet another example circuit diagram of a pixel circuit.

FIG. 15 shows yet another example circuit diagram of a pixel circuit.

The example pixel circuit of FIG. 15 differs from the example pixel circuit shown in FIG. 9 in several ways. First, a capacitor (C2) is connected between the drain of the switch (n-MOS transistor; SW2) and the gate of p-MOS charge transistor (PM1) and n-MOS discharge transistor (NM1). Second, the drain of the switch (n-MOS transistor; SW2) is connected to the power supply line (LV1) through a switch (S4) that is controlled by a pressure-rise control signal (CS). Third, a switch (SW5) that is controlled by the pressure-rise control signal (CS) is connected between the gate of the p-MOS charge transistor (PM1) and the n-MOS discharge transistor (NM1) and the drain of the p-MOS charge transistor (PM1) and the n-MOS discharge transistor (NM1).

The voltage (V1) that is applied to the power-supply line (LV1) is set at a voltage level between the L level data voltage and the H level data voltage. If the feed-through in this example pixel circuit is considered, the voltage (V1) should be somewhat lower than the midpoint between the L level data voltage and the H level data voltage.

The pixel circuit in this example has the added function of a comparator in the inverter configured with the p-MOS charge transistor (PM1) and the n-MOS discharge transistor (NM1). The comparator serves to determine the threshold voltage of p-MOS charge transistor (PM1) and the n-MOS discharge transistor (NM1) for storage on a capacitor C2.

Figure 16:
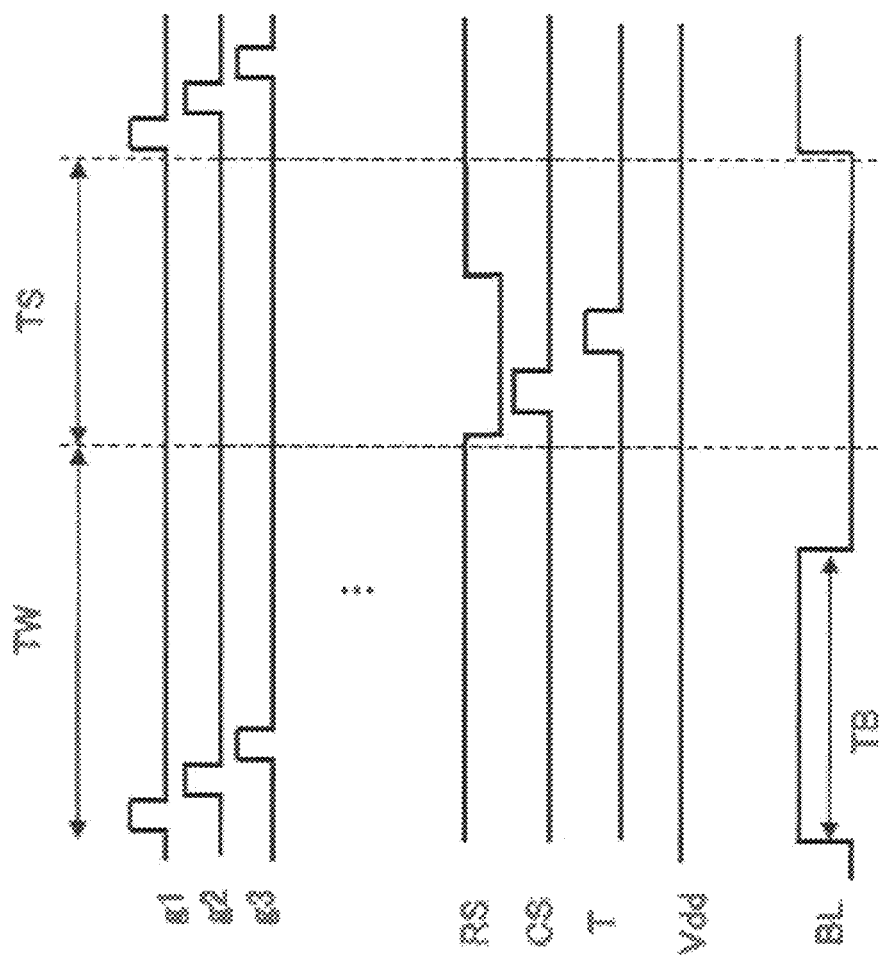
FIG. 16 shows an example timing diagram for operation of the pixel circuit of FIG. 15.

FIG. 16 shows an example timing diagram for operation of the pixel circuit of FIG. 15. In FIG. 15, switches (SW4 and SW5) are configured as n-MOS transistors. As shown in FIG. 16, the frame period is separated into a writing/illumination period (TW) and a shutter movement period (TS). In FIG. 16, BL indicates the output of the backlight and TB indicates the illumination period of the backlight.

The operation of the pixel circuit of FIG. 15 during the writing/illumination period shown as in FIG. 16 is similar to that of the operation of the pixel circuit shown in FIG. 1.

Since the backlight (BL) is switched off in the shutter movement period (TS), and the latch control signal (RS) of the latch control line (LRS) is at an L level voltage, the switch (n-MOS transistor; SW3) is switched OFF.

The pressure-rise control signal (CS) of the pressure-rise control line (LSC) is at an H level voltage, and thus the switch (n-MOS transistor; SW4) is turned ON. The voltage V1 is stored on one terminal of the Capacitor (C2).

Similarly, if the pressure-rise control signal (CS) of the pressure-rise control line (LSC) is at an H level voltage, the switch (n-MOS transistor; SW5) is switched ON. The input-output interval of the inverter configured with a p-MOS charge transistor (PM1) and an n-MOS discharge transistor (NM1) is shortened. The voltage of the other terminal of the capacitor (C2) is at the threshold voltage of the inverter configured with the p-MOS charge transistor (PM1) and the n-MOS discharge transistor (NM1).

In this state, the pressure-rise control signal (CS) of the pressure-rise control line (LSC) acquires an L level voltage. If the switch (n-MOS transistor; SW5) is switched OFF, a voltage difference is maintained on the capacitor (C2) between the voltage V1 and the threshold voltage of the inverter configured with the p-MOS charge transistor (PM1) and the n-MOS discharge transistor (NM1).

Subsequently, since the data transfer control signal (T) of the data transfer control line (LT) is at an H level voltage, the switch (n-MOS transistor; SW2) is switched ON. The voltage on the retention capacitor (C1) is applied to the gate of the p-MOS charge transistor (PM1) and the n-MOS discharge transistor (NM1) through the retention capacitor (C1).

The voltage of Node (N2) and Node (N3) is determined by the pressure-rise.

The malfunctioning of the data latch can be prevented by switching the switch (n-type MOS transistor; SW3) by the latch control signal (RS) at the time of data voltage transfer. In this example, the voltage of power-supply line (LVdd) is kept constant and the operation can be simplified.

An example display can be formed using an arrangement of the pixel circuits of the example of FIG. 15 in a two-dimensional array, where each corresponds to a pixel (PIX). Here, scan lines (LG) are coupled to every row and the scan line driving circuit 104.

Data lines (LD) are coupled to every column and the data line driving circuit 102. The power-supply lines (LVdd, GND, and LV1), the data transfer control line (LT), the latch control line (LRS), the pressure-rise control line (LCS), and the movable shutter control line (LSS) are coupled commonly to every pixel and the data line driving circuit 102.

In a display based on the example pixel circuits of FIG. 15, data is written to every pixel (PIX) in every row during the writing/illumination period (TW), and the movable shutter (S) is moved towards a first electrode 116 or towards a second electrode 122 during the shutter movement period (TS). An image corresponding to the written data is displayed during the subsequent writing/illumination period (TW).

REFERENCE NUMERALS

100 Display panel
101 Display area
102 Data line driving circuit
103 Flexible printed circuit
104 Scan line driving circuit
111, 200 First Substrate
112 Light interception film
113 Second Substrate
114 TFT circuit formation part
115, 117, 120, 121 Contact portion
116, 122 Electrodes
118, 202, S Movable Shutter
119 Seal material
201 Opening
211 Light shielding part of Movable Shutter
212 Opening part of Movable Shutter
213 First Spring
214 Second Spring
215 Anchor part
LG Scan line
LD Data line
PM*p-MOS transistor
NM* n-MOS transistor
SW1 Input transistor
SW2~SW5 Switch
C1 Retention capacitor
C2 Capacity
LVdd, GND, LVI Power-supply line
LSS Movable Shutter control line
LT Data transfer control line
LRS Latch control line
LSC Pressure-rise control line
PIX Pixel Although this disclosure has been described based on the examples herein, this disclosure is not limited to these examples. Various changes can be made to the examples herein without departing from the scope of this disclosure.

What is claimed is:
1. An apparatus, comprising:
a plurality of MEMS devices arranged in an array; and
a control circuit coupled to the plurality of MEMS devices to communicate data and drive voltages to the MEMS devices, the control circuit, for each MEMS device, including:
  a latch configured to actuate a shutter of the MEMS device, the latch including:
    first and second cross-coupled inverters, each including at least two transistors; and
    an inverter coupling interconnect coupling gates of the at least two transistors of the first inverter to drains of the at least two transistors of the second inverter; and
    an inverter coupling interconnect switch including a transistor positioned on the inverter coupling interconnect configured to control a passage of a current between the first and second inverters;
  a second switch including a transistor that is coupled to the inverter coupling interconnect and to the gate of the at least two transistors of the first inverter and is configured to communicate the data to the gate of the at least two transistors of the first inverter;
  a latching control line coupled to the inverter coupling interconnect switch; and
  a data transfer control line coupled to the second switch, wherein a latch control signal from the latching control line causes the inverter coupling interconnect switch to switch to an OFF state at a time that the second switch communicates the data to the gate of the at least two transistors of the first inverter based on a data transfer control signal from the data transfer control line.

2. The apparatus of claim 1, wherein the latch is coupled to a first actuator and a second actuator and is configured to maintain difference in voltages on the first and second actuators, and wherein the first and second actuators actuate the shutter based on the difference in voltages.

3. The apparatus of claim 1, wherein the inverter coupling interconnect switch includes an n-type transistor.

4. The apparatus of claim 1, wherein the inverter coupling interconnect switch includes a p-type transistor.

5. The apparatus of claim 1, wherein, in operation, the inverter coupling interconnect switch is switched to an ON state after the time that the second switch communicates the data to the gate of the at least two transistors of the first inverter.

6. The apparatus of claim 1, wherein a drain of the second switch is coupled to the inverter coupling interconnect and to the gate of the at least two transistors of the first inverter.

7. The apparatus of claim 1, wherein the latching control line is coupled to respective gates of the inverter coupling interconnect switch and the second switch.

8. The apparatus of claim 7, wherein the transistor of the inverter coupling interconnect is of a different conductivity type from the transistor of the second switch.

9. The apparatus of claim 7, wherein a gate of the inverter coupling interconnect switch is coupled to the latching control line.

10. The apparatus of claim 7, wherein a gate of the second switch is coupled to the data transfer control line.

11. The apparatus of claim 1, wherein the apparatus is a display apparatus and the MEMS device comprises a shutter, wherein the latch is coupled to a first actuator and a second actuator and is configured to maintain difference in voltages on the first and second actuator, and wherein the first and second actuators actuate the shutter based on the difference in voltages.

12. An apparatus, comprising:
a plurality of MEMS devices arranged in an array; and
a control circuit coupled to the plurality of MEMS devices to communicate data and drive voltages to the MEMS devices, the control circuit, for each MEMS device, including:
a latch configured to actuate a shutter of the MEMS device, the latch including:
  two cross-coupled inverters, each of a first inverter and a second inverter of the two cross-coupled inverters including at least two transistors; and inverter coupling interconnect switch;
  wherein an inverter coupling interconnect couples a common gate of the at least two transistors of the first inverter to a common drain of the at least two transistors of the second inverter; and
  wherein the inverter coupling interconnect switch is positioned on the inverter coupling interconnect;
a second switch that is coupled to the inverter coupling interconnect and to the gate of the at least two transistors of the first inverter; and
a third switch that is coupled to a power supply line, to the second switch and to the gate of the at least two transistors of the first inverter.

13. The apparatus of claim 12, wherein the second switch is configured to communicate the data to the gate of the at least two transistors of the first inverter.

14. The apparatus of claim 12, wherein the second switch includes a transistor, and wherein the third switch is coupled to a drain of the second switch.

15. The apparatus of claim 12, wherein the latch further includes a fourth switch that is connected between the common gate of the at least two transistors of the first inverter to a common drain of the at least two transistors of the first inverter.

16. The apparatus of claim 15, wherein the latch further includes a capacitor that couples the third switch to the gate of the at least two transistors of the first inverter, and wherein the latch is configured such that the inverter coupling interconnect switch is in an OFF state at a time that (i) the third switch and the fourth switch are switched to an OFF state and subsequently switched to an ON state, and (ii) at a subsequent time that the second switch communicates the data to the gate of the at least two transistors of the first inverter through the capacitor.

17. The apparatus of claim 12, wherein the latch is coupled to a first actuator and a second actuator and configured to maintain difference in voltages on the first and second actuators, and wherein the first and second actuators actuate the shutter based on the difference in voltages.

* * * * *